United States Patent
Lo (10) Patent No.: US 10,776,273 B2
(45) Date of Patent: Sep. 15, 2020

(54) MEMORY SYSTEM HAVING MULTIPLE CACHE PAGES AND OPERATING METHOD THEREOF

(71) Applicant: SK hynix Inc., Gyeonggi-do OT (KR)

(72) Inventor: Yungcheng Lo, Cupertino, CA (US)

(73) Assignee: SK hynix Inc., Gyeonggi-do (KR)

( * ) Notice: Subject to any disclaimer, the term of this patent is extended or adjusted under 35 U.S.C. 154(b) by 51 days.

(21) Appl. No.: 15/595,592

(22) Filed: May 15, 2017

(65) Prior Publication Data

US 2017/0329709 A1 Nov. 16, 2017

Related U.S. Application Data

(60) Provisional application No. 62/337,106, filed on May 16, 2016.

(51) Int. Cl.

| G06F 12/0831 | (2016.01) |
| G06F 12/0868 | (2016.01) |
| G06F 12/0813 | (2016.01) |
| G06F 12/0897 | (2016.01) |
| G06F 3/06 | (2006.01) |
| G06F 12/0866 | (2016.01) |
| G11C 16/10 | (2006.01) |
| G06F 12/02 | (2006.01) |
| G11C 16/26 | (2006.01) |
| G11C 16/04 | (2006.01) |

(52) U.S. Cl.
CPC ........ *G06F 12/0835* (2013.01); *G06F 3/0679* (2013.01); *G06F 12/0246* (2013.01); *G06F 12/0813* (2013.01); *G06F 12/0866* (2013.01); *G06F 12/0868* (2013.01); *G06F 12/0897* (2013.01); *G06F 2212/2022* (2013.01); *G06F 2212/7211* (2013.01); *G11C 16/0483* (2013.01); *G11C 16/26* (2013.01)

(58) Field of Classification Search
CPC ............... G06F 12/0246; G06F 3/0679; G06F 12/0813; G06F 12/0897; G06F 12/0866; G06F 12/0868; G06F 12/0835
USPC .................. 711/103, 119, E12.001, E12.008
See application file for complete search history.

(56) References Cited

U.S. PATENT DOCUMENTS

| 5,752,272 | A | * | 5/1998 | Tanabe ................... G06F 9/383 711/154 |
| 6,839,821 | B2 | | 1/2005 | Estakhri |
| 7,426,675 | B2 | | 9/2008 | Harrand |
| 9,201,825 | B1 | * | 12/2015 | Zhou ..................... G06F 13/385 |
| 9,239,784 | B1 | * | 1/2016 | Haghighi ............ G06F 12/0246 |

(Continued)

*Primary Examiner* — Tuan V Thai
*Assistant Examiner* — Edward Waddy, Jr.
(74) *Attorney, Agent, or Firm* — IP & T Group LLP (57) ABSTRACT

A semiconductor memory system and an operating method thereof include a controller; and a memory device including a memory page manager, Nand pages, and multiple cache pages, wherein the Nand pages include current Nand pages and next Nand pages, wherein the current Nand pages is corresponding to a read command received from the controller, the memory page manager is configured to manage correlation of the Nand pages and the multiple cache pages, predict next Nand pages in accordance at least in part with the read command, the current Nand pages, or a combination thereof, and send the Nand pages to the controller, and the multiple cache pages contain pages loaded from the Nand pages.

20 Claims, 6 Drawing Sheets

(56) References Cited

U.S. PATENT DOCUMENTS

| | | | |
|---|---|---|---|
| 2005/0080994 A1* | 4/2005 | Cohen | G06F 1/3225 711/118 |
| 2005/0262306 A1* | 11/2005 | Nenov | G06F 12/128 711/136 |
| 2005/0262516 A1* | 11/2005 | Chow | G06F 12/0891 719/315 |
| 2006/0031635 A1* | 2/2006 | Zohar | G06F 12/0862 711/113 |
| 2007/0276990 A1* | 11/2007 | Mosek | G06F 12/0862 711/103 |
| 2014/0281151 A1* | 9/2014 | Yu | G06F 3/064 711/103 |

* cited by examiner

MEMORY SYSTEM HAVING MULTIPLE CACHE PAGES AND OPERATING METHOD THEREOF

CROSS REFERENCE TO OTHER APPLICATIONS

This application claims priority to U.S. Provisional Patent Application No. 62/337,106 entitled MULTIPLE CACHE-LIKE PAGE REGISTERS IN NAND filed May 16, 2016, which is incorporated herein by reference for all purposes.

BACKGROUND

1. Field

Exemplary embodiments of the present disclosure relate to a memory system, and more particularly to a semiconductor memory system having duplicated cache pages and operating method thereof.

2. Description of the Related Art

The use of computer systems and portable electronic devices has been rapidly increased in the digital era. The memory system, such as NAND flash memory, as well as other types of non-volatile memories, are commonly used as a mass storage in the electronic devices. Due to this fact, the reliability and performance of the digital data storage is critical.

Currently, one page register in Nand is preserved to be read to the controller, for a promptly access to the commands issued by the controller. When the commands are executed, Nand can be idle waiting for the next command issued from the controller. It is not efficient for fully utilizing Nand bandwidth under the current Nand access mechanism.

Thus, there remains a need for a memory system having duplicated cache pages and operating method thereof. In view of the ever-increasing need to improve performance and reliability, it is more and more critical that answers be found to these problems. Solutions to these problems have been long sought but prior developments have not taught or suggested any solutions and, thus, solutions to these problems have long eluded those skilled in the art.

SUMMARY

Embodiments of the present disclosure are directed to a memory system having duplicated cache pages and operating method thereof capable of improving the performance of the memory system.

A method of operating a semiconductor memory system comprises sending a read command from a controller to a memory device; loading Nand pages corresponding to the read command to the multiple cache pages; managing correlation of the Nand pages and the multiple cache pages by a memory page manager; predicting next Nand pages in accordance at least in part with the read command, the current Nand pages, or a combination thereof, by the memory page manager; and sending the Nand pages to the controller.

A semiconductor memory system comprises a controller; and a memory device including a memory page manager, Nand pages, and multiple cache pages, wherein the Nand pages include current Nand pages and next Nand pages, wherein the current Nand pages is corresponding to a read command received from the controller, the memory page manager is configured to manage correlation of the Nand pages and the multiple cache pages, predict next Nand pages in accordance at least in part with the read command, the current Nand pages, or a combination thereof, and send the Nand pages to the controller, and the multiple cache pages contain pages loaded from the Nand pages.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various drawings and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying drawings that illustrate the principles of the invention. The invention is described in connection with such embodiments, but the invention is not limited to any embodiment.

The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Currently in a memory system, a controller can control operations by issuing commands to memory devices, such as non-volatile memories. The commands issued by the controller can be stored in one specified page register in Nand to be read by the controller. Nand operations can be controlled by Nand commands issued from the controller.

The Nand operations, such as a read operation, can start from issuing a read Nand command from the controller, wherein the read Nand command includes information associated therewith, such as Nand page addresses. Nand pages can be read from the Nand in accordance with the Nand page addresses and saved to the page register. After the Nand pages are read from Nand to the page register, serial reads can be executed to transfer consecutive Nand pages in the page register to the controller. In the meantime, Nand can be idled during Nand pages are transferred from the page register to the controller. It is not efficient for fully utilizing Nand bandwidth under the current read mechanism.

Embodiments of the current invention provides an apparatus and operating method can fully utilize Nand read operation and Nand bandwidth. Since most of the read commands are sequential or correlated to the adjacent commands thereof, the idle time can be utilized to transfer next most possible pages to other page registers to save time, such as other cache-like page registers. When the current serial reads are completed, next serial reads indicated by the other page registers can start immediately as soon as the bandwidth is available, without waiting for Nand pages loaded into the page register.

Similar to the purpose of utilizing cache memory besides CPU to speed up the operation on some predictable operation units, more cache-like page registers can be created in Nand to store the next most possible pages to be read in Nand to fully utilize page read commands and Nand bandwidth.

Figure 1:
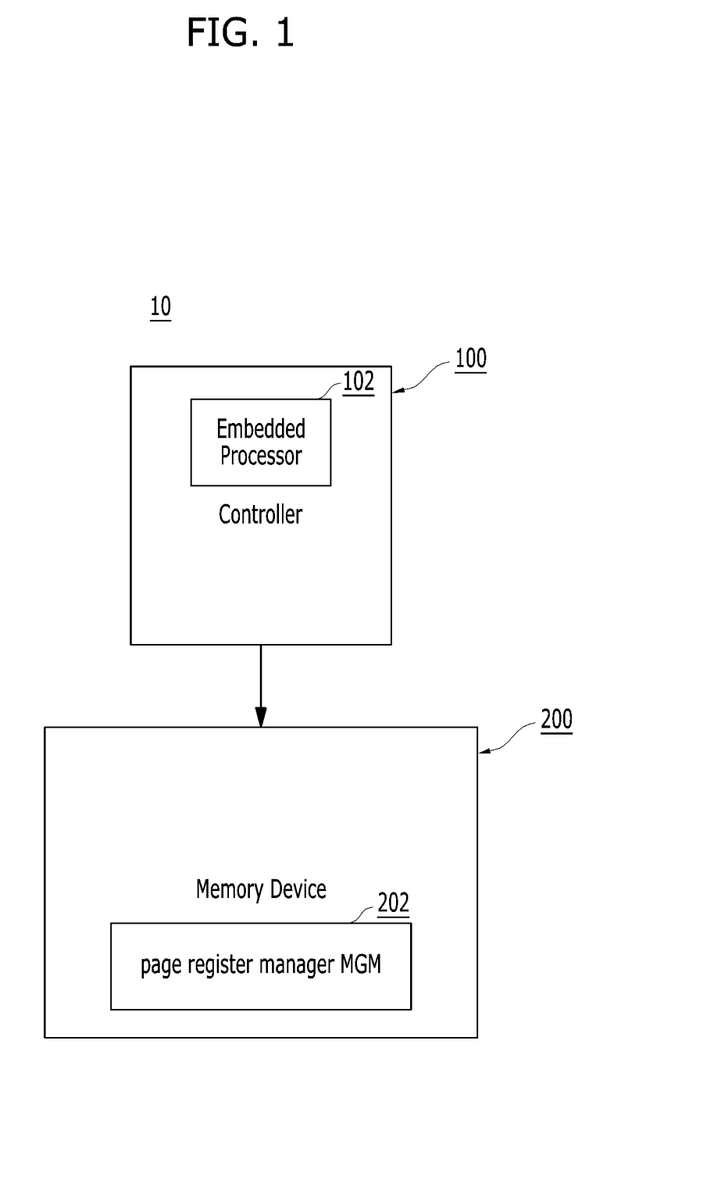
FIG. 1 is a top-level block diagram schematically illustrating a semiconductor memory system in accordance with an embodiment of the present invention.

FIG. 1 is a top-level block diagram schematically illustrating a semiconductor memory system in accordance with an embodiment of the present invention. Referring FIG. 1, the memory system 10 may include a controller 100 and a memory device 200. The controller 100 may control overall operations of the memory device 200.

The memory device 200 may perform one or more erase, program, and read operations under the control of the controller 100, wherein the controller may include an embedded processor 102, the memory device 200 can include a page register manager MGM 202. Detailed descriptions of the page register manager MGM 202 can be found in the embodiments of the present invention.

The memory device 200 may receive a command CMD, an address ADDR and data through input/output lines. The memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The controller 100 and the memory device 200 may be integrated in a single semiconductor device. For example, the controller 100 and the memory device 200 may be integrated in a single semiconductor device such as a SSD. The SSD may include a storage device for storing data therein. When the memory system 10 is used in an SSD, operation speed of a host (not shown) coupled to the memory system 10 may remarkably improve.

The controller 100 and the memory device 200 may be integrated in a single semiconductor device such as a memory card. For example, the controller 100 and the memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced size multimedia card (RS-MMC), a micro-size version of MMC (micro MMC), a secure digital (SD) card, a mini secure digital (mini SD) card, a micro secure digital (micro SD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data centre, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
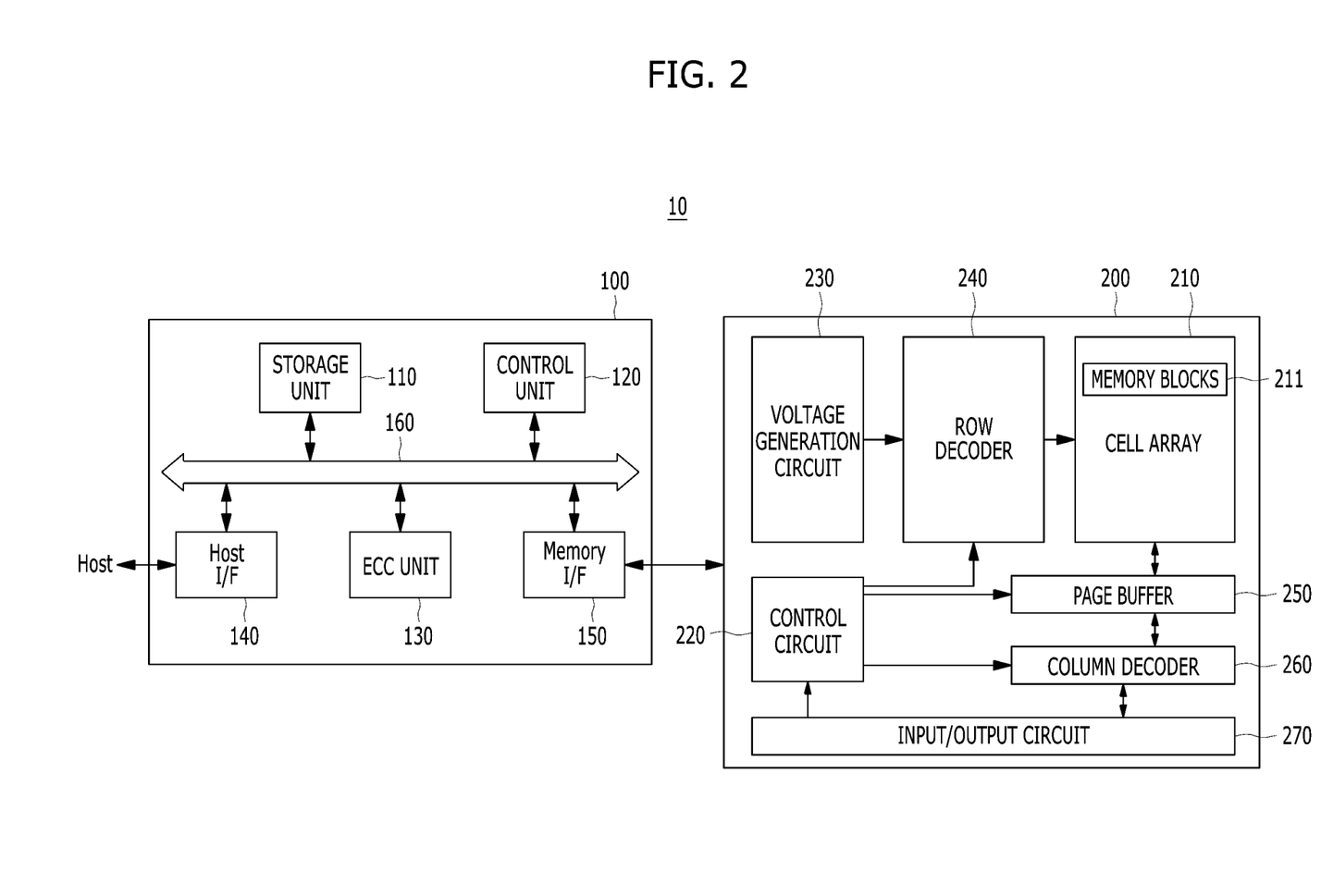
FIG. 2 is a detailed block diagram illustrating a semiconductor memory system in accordance with an embodiment of the present invention.

FIG. 2 is a detailed block diagram illustrating a semiconductor memory system in accordance with an embodiment of the present invention. For example, the semiconductor memory system of FIG. 2 may depict the memory system 10 shown in FIG. 1.

Referring to FIG. 2, the memory system 10 may include the controller 100 and the memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magneto-resistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the controller 100), transmit data from the external device to the column decoder 260, or output data from the column decoder 260 to the external device, through the input/output circuit 270.

The control circuit 220 may control the peripheral circuit in response to the command and the address.

Figure 3:
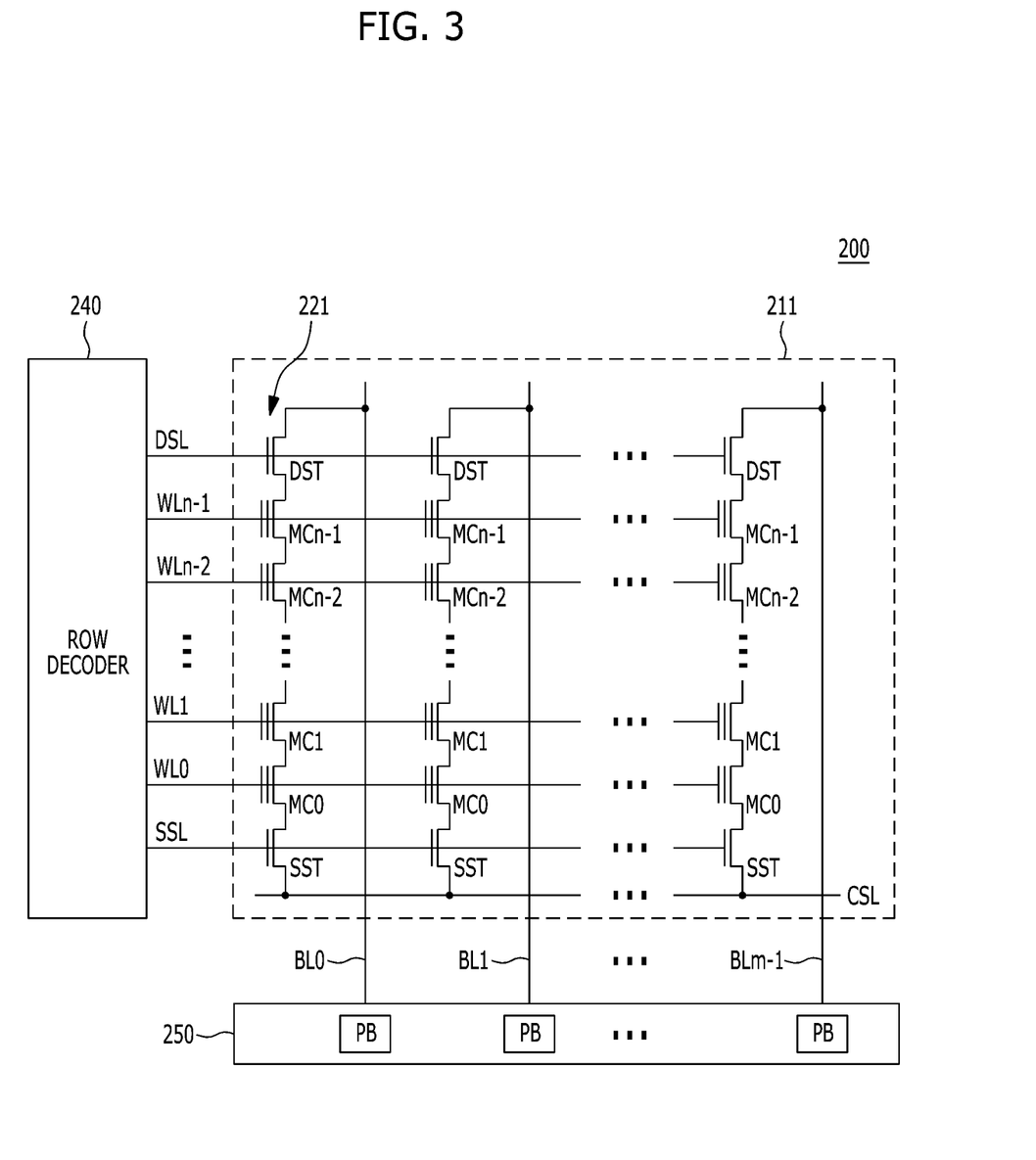
FIG. 3 is a circuit diagram illustrating a memory block of semiconductor memory devices in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory device 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST.

Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
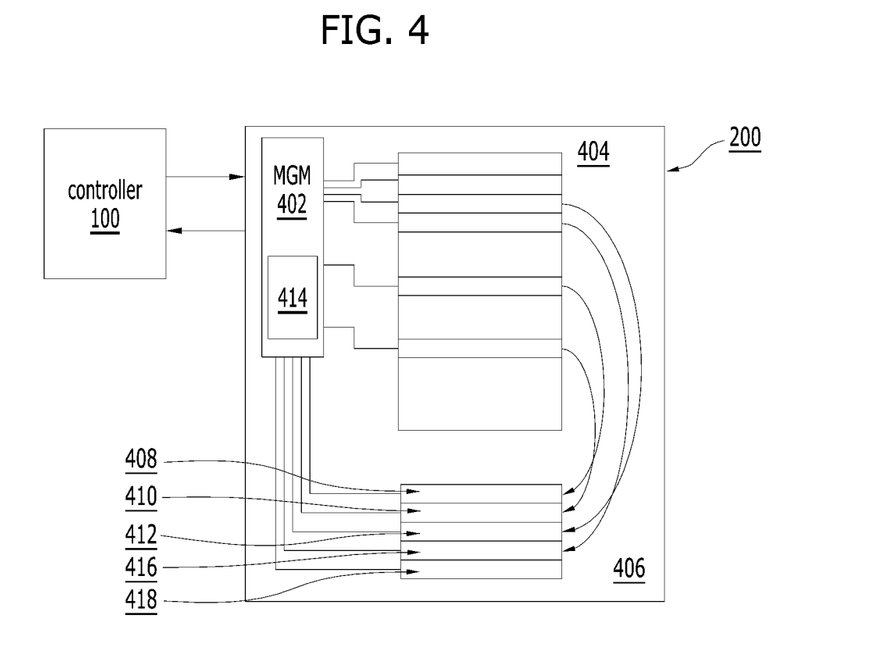
FIG. 4 is a block diagram schematically illustrating multiple cache pages of a semiconductor memory system in accordance with an embodiment of the present invention.

FIG. 4 is a block diagram schematically illustrating multiple cache pages of a semiconductor memory system in accordance with an embodiment of the present invention. The memory system can comprise a controller 100 of FIG. 1, and a memory device 200 of FIG. 1, such as a Nand Flash. The memory device 200 can include a memory page manager (MGM) 402, memory pages, such as Nand pages 404, and multiple page registers, such as multiple cache pages 406.

As described above, the controller 100 and the memory device 200 can communicated via data path and command path for transmitting control signals and data for conducting a plurality of memory operations.

The memory device 200 can include the memory page manager 402, wherein the memory page manager (MGM) 402 can be utilized to manage the Nand pages 404, the multiple cache pages 406, and the correlations there between.

When the Nand commands, such as read commands, are received from the controller 100, the memory page manager MGM 402 can read from the current Nand pages in the Nand pages 404 corresponding to the read commands. The Nand data corresponding to the read commands can be saved to one of the multiple cache pages 406, such as a first cache page 408. When the controller 100 is ready for receiving the read data, the memory page manager MGM 402 can start the serial reading from the first cache pages 408 and forward the read data to the controller 100 via the data path.

During the serial reading from the first cache pages 408, the Nand 200 can be idle most of the time waiting for the next command from the controller 100. However, the idle time in the Nand 200 without operation wastes time and degrades the performance of the memory system. For maximum utilization of Nand bandwidth and improvement of performance, the embodiments of the present invention provide an apparatus and operating method thereof to keep Nand operating during the idle time by predicting most possible next pages and moving Nand data corresponding to the most possible next pages to be read to another one of the multiple cache pages 406, such as a second cache pages 410. Usually, the most possible next pages to be read can be precisely predicted as next page or previous page of the current Nand pages. During the idle time of the current Nand pages, the Nand 200 can transfer the most possible next pages to be read to another page register/cache pages. Thus, when the next read command is received from the controller 100, the Nand 200 can be ready to start another serial reading from the second cache pages 410, without waiting for moving the corresponding Nand pages from the Nand pages 404 to one of the multiple cache pages 406. The said read operation mechanism and the utilization of multiple cache pages/page registers can reduce cycle time of the read operation by keeping the Nand 200 operate during the idle time.

The size and location of the multiple cache pages 406 can be various and predetermined in accordance with a plurality of factors, such as Nand pages size, memory system configuration, and memory system performance requirements. For example, one or two cache pages can be designated to every 128 k Nand pages. Optionally, the size of the multiple cache pages 406 can be dynamically determined in accordance with the idle time of Nand. For example, a larger sized cache pages may be designated when the idle time of Nand is longer, while a smaller sized cache pages may be designated when the idle time of Nand is shorter.

The memory page manager MGM 402 can control the communication between the Nand pages 404 and the controller 100, and also manage the correlation between the Nand pages 404 and the multiple cache pages 406. When the memory page manager MGM 402 receives the first read command from the controller 100, the memory page manager MGM 402 can manage the first Nand pages corresponding to the first read command moved from the Nand pages 404 to the first cache pages 406. After the completion of moving the first Nand pages to the first cache pages 406, a correlation of the first cache pages 408 and the Nand pages can be established and saved by the memory page manager MGM 402.

Upon the completion of moving the first Nand pages to the first cache pages 406, if the controller 100 is ready to receive the Nand pages corresponding to the first read command, the memory page manager MGM 402 can start a serial reading to read data from the first cache pages 408 to the controller 100. If the controller 100 is not ready, the Nand may need to wait for transferring the read data from the first cache pages 408. In both scenarios, the Nand 200 can be idle after the completion of moving the Nand pages 404 to the multiple cache pages 406. During the idle time, the memory page manager MGM 402 can predict the most possible next Nand pages to be read without instruction of a next read command.

Various algorithms can be utilized to predict the most possible next Nand pages to be read in the embodiments of the present invention. Since typically the data are saved into Nand pages 404 consecutively, the most possible next Nand pages to be read can be the subsequent Nand pages or previous Nand pages immediately adjacent to the first Nand pages. During the idle time, the memory page manager MGM 402 can predict the most possible next Nand pages as the subsequent Nand pages or previous Nand pages immediately adjacent to the first Nand pages, and manage to move the most possible next Nand pages to one of the multiple cache pages 406 other than the first cache pages 408. For example, the subsequent Nand pages immediately adjacent to the first Nand pages can be moved to the second cache pages 410. After the completion of moving the most possible next Nand pages/second Nand pages to the second cache pages 410, a correlation of the second cache pages 410 and the second Nand pages can be established and saved by the memory page manager MGM 402. When the controller is ready to receive the read data corresponding to the second read command, the memory page manager MGM 402 can immediately start the second serial reading from the second cache pages 410, resulting in reduction of the read cycle time and improvement of throughput of read pipeline.

Following the same principal, during the idle time following the completion of moving the second Nand pages to the second cache pages 410, the memory page manager MGM 402 can predict another most possible next Nand pages/third Nand pages, and move the third Nand pages to another one of the multiple cache pages other than the second cache pages 410, such as a third cache pages 414. The third cache pages 414 can be selected to load the predicted Nand pages. The correlation between the third cache pages 414 and the corresponding predicted Nand pages can be established and managed by the memory page manager MGM 402.

The memory page manager MGM 402 can manage the multiple cache pages 406. Optionally, a cache MGM 414 can be included in the memory page manager MGM 402 for managing the multiple cache pages 406. Various algorithms can be utilized by the MGM 402 to predict the most possible next Nand pages, in accordance with the operation commands, the status of the Nand pages, such as reading/writing/erasing, or a combination thereof. The cache pages 406 can be categorized in accordance with criteria of predication. The predication criteria can include the most possible subsequence Nand pages, the most possible prior Nand pages, most frequently hit Nand pages, wrong predicated Nand pages, or a combination thereof. The cache pages occupied corresponding to the prior command can be preserved for a few operation cycles, instead of being overwritten immediately in the next operation cycle. The preservation can avoid moving the same Nand pages to the cache pages 406 repeatedly when resending the data in case of error happens.

The MGM 402 or the cache MGM 414 can select one of the cache pages 406 in accordance with the prediction algorithm. For example, when the algorithm predicting the most frequent hit pages is utilized for predication, the predicted most frequently hit pages can be moved from the Nand pages to one of the cache pages 406 designated to the criterion of the most frequently hit pages, such as a most frequently hit cache pages 416. Upon the completion of moving the current Nand pages to the cache pages, the memory page manager MGM 402 or the cache MGM 414 can control the movement from the Nand pages to the most frequently hit cache pages 416, since the predication algorithm is known as predicting the most frequent hit pages.

In the embodiments of the present invention, the memory device can perform some control functions by the memory page manager MGM. The memory device conducting additional control functions may be a smarter memory device, or embedding a small artificial intelligent (AI).

When the second read command is received, a validation of the predicted Nand pages and the actual Nand pages corresponding the second read command can be conducted before the data transferred from the second cache pages 410 to the controller 100. If the predicted Nand pages and the actual Nand pages corresponding the second read command are not matching, the actual Nand pages corresponding the second read command can be loaded to one of the multiple cache pages 406, such as the wrong predicated Nand pages 418. The predicted Nand pages loaded in the second cache pages 410 can be erased, or can be temporarily preserved. If the predicted Nand pages and the actual Nand pages corresponding the second read command are matching, the read data can be transferred from the second cache pages 410 to the controller 100. The information of the actual Nand pages can be embedded in the second read command.

The predication of the most possible next Nand pages can be calculated in accordance with various factors by the various algorithms, such that the current Nand pages information, the operation commands, the status of the Nand pages and blocks, pointers of the Nand pages and blocks, the status of the cache registers, or the combination thereof. Since the memory systems read and write data chunks sequentially in the memory pages, the probability of the most possible next Nand pages being the subsequent pages can be the substantially high, while the probability of being the most frequently hit pages can be high as well.

It has been discovered that by designating multiple cache pages/read registers, a memory page manager MGM can predict the most possible next Nand pages to be read and preload the next possible next Nand pages to one of the multiple cache pages or read registers. The current serial reading can be performed concurrently with preloading the next Nand pages to reduce the read cycle time, by eliminating the idle time waiting for the next instruction and preloading the next Nand pages to the cache pages.

Figure 5:
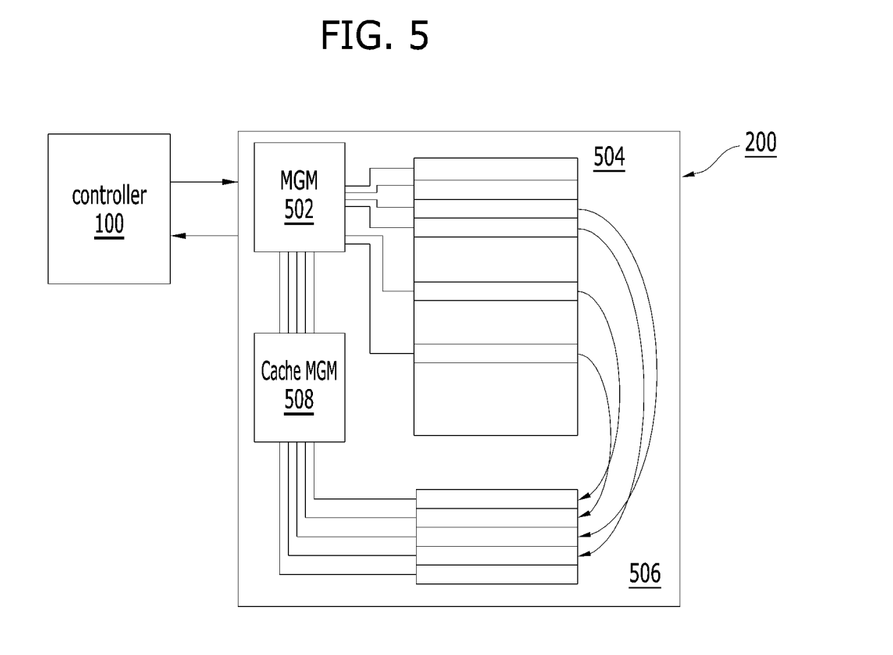
FIG. 5 is a block diagram schematically illustrating multiple cache pages of a semiconductor memory system in accordance with another embodiment of the present invention.

FIG. 5 is a block diagram schematically illustrating multiple cache pages of a semiconductor memory system in accordance with another embodiment of the present invention. The memory system can comprise a controller 100 of FIG. 1, and a memory device 200 of FIG. 1, such as a Nand Flash. The memory device 200 can include a memory page manager (MGM) 502, memory pages, such as Nand pages 504, and multiple page registers, such as multiple cache pages 506.

The MGM 502 can manage the multiple cache pages 506. Similar to the cache MGM 414 of FIG. 4, a cache MGM 508 external to the MGM 502 can be designated for managing the multiple cache pages 506. The cache MGM 508 can perform the same cache management functions described above, as the cache MGM 414 does. The position of the cache MGM can be internal or external to the MGM in accordance with the configurations of the memory system.

Figure 6:
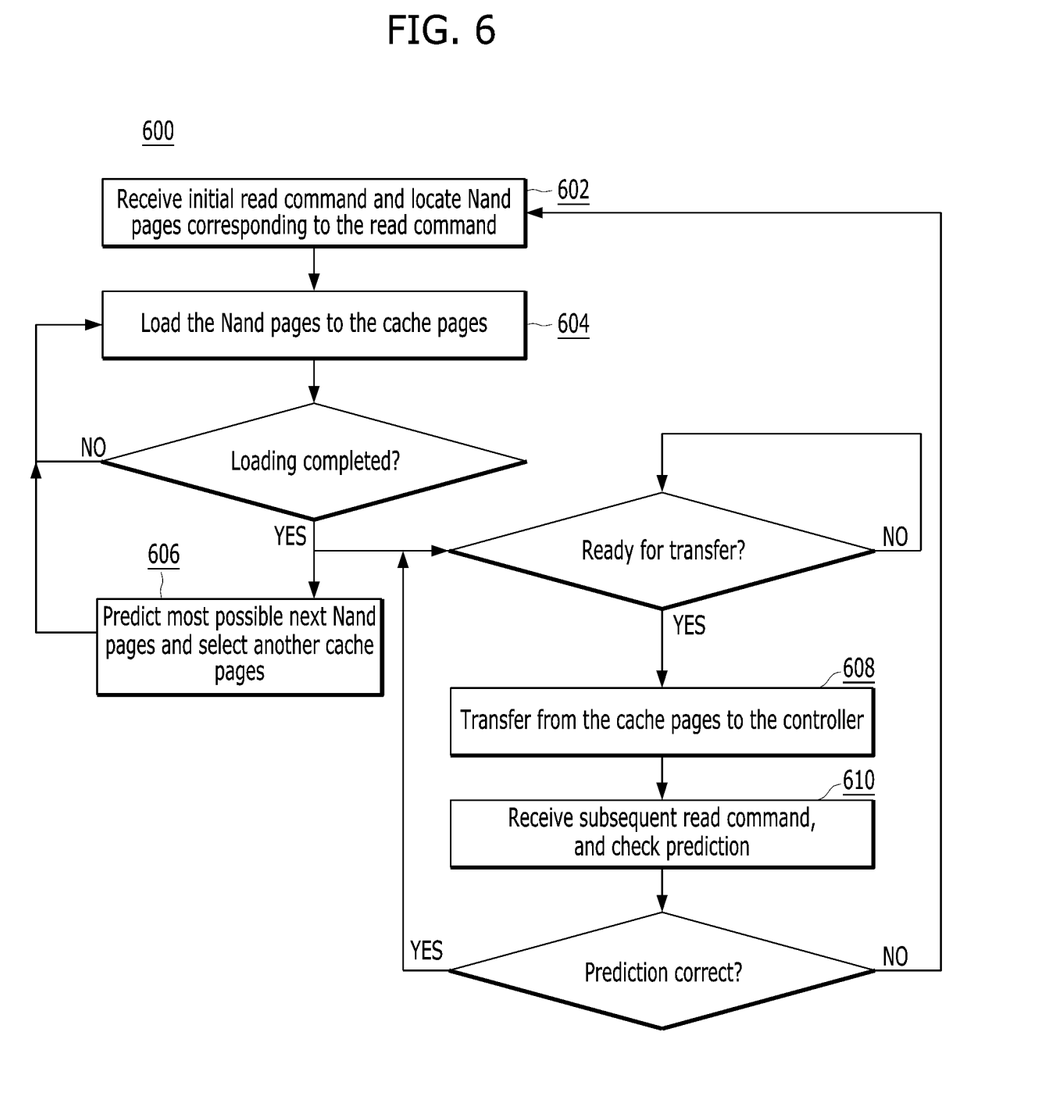
FIG. 6 is a diagram illustrating read operation with multiple cache pages in a memory system in an embodiment of the present invention.

FIG. 6 is a diagram illustrating read operation with multiple cache pages in a memory system in an embodiment of the present invention. The read operation 600 can comprise with various steps.

The read operation 600 first receive an initial read command, and locate Nand pages corresponding to the initial read command in step 602. In step 604, the Nand pages corresponding to the initial read command can be loaded to one of the multiple cache pages. Upon the completion of loading the Nand pages into the cache pages, the most possible next Nand pages can be predicted and next cache pages can be selected, in a step of 606. The predicted most possible next Nand pages can be loaded into the next cache pages. When the controller is ready to transfer the read data corresponding to the initial read command, the data loaded in the cache pages can be transferred to the controller in a step 608. The correlation of the Nand pages and corresponding cache pages can be established and saved.

When the controller receives a subsequent read command, the predicted Nand pages can be validated with the actual Nand pages corresponding to the subsequent read command. When the validation is successful, the predicted read data can be transferred from one of the multiple cache pages in accordance with the correlation, in a step 610. When the validation is failed, such that the predicted Nand pages do not match the actual Nand pages corresponding to the subsequent read command, the actual Nand pages corresponding to the subsequent read command can be loaded to one of the cache pages. The predicted Nand pages can be erased.

Figure 7:
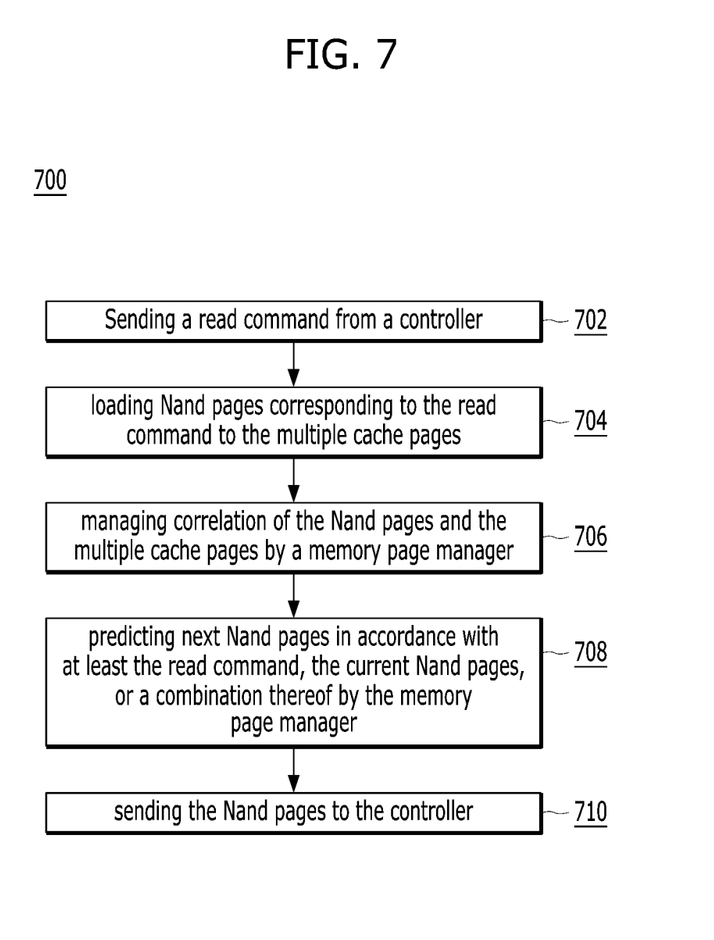
FIG. 7 is a flowchart illustrating operating method of a memory system in a further embodiment of the present invention.

FIG. 7 is a flowchart illustrating operating method of a memory system in a further embodiment of the present invention. The flowchart 700 includes sending a read command from a controller to a memory device in a block of 702; loading Nand pages corresponding to the read command to the multiple cache pages in a block of 704; managing correlation of the Nand pages and the multiple cache pages by a memory page manager in a block of 706;

predicting next Nand pages in accordance at least in part with the read command, the current Nand pages, or a combination thereof, by the memory page manager in a block of 708; and sending the Nand pages to the controller in a block of 710.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A semiconductor memory system comprising:
   a controller; and
   a memory device including a memory page manager, Nand pages, and multiple cache pages, wherein
   the Nand pages include current Nand pages that correspond to a read command received from the controller,
   the multiple cache pages include one or more first cache pages (set of first cache pages) for the current Nand pages, one or more second cache pages (set of second cache pages) for next Nand pages, and one or more third cache pages (set of third cache pages) for subsequent Nand pages, a size of each of the multiple cache pages being dynamically determined to be larger as Nand idle time increases and determined to be smaller as Nand idle time decreases,
   the memory page manager is configured to load the current Nand pages to the set of first cache pages, correlate the current Nand pages with the set of first cache pages, predict the next Nand pages to be requested based at least in part on the read command, the current Nand pages, or a combination thereof, load the next Nand pages to the set of second cache pages, correlate the next Nand pages with the set of second cache pages, and manage correlation of the Nand pages that have been loaded to cache pages and their respective sets of cache pages, and
   each of the sets of second and third cache pages is categorized in accordance with criteria used to predict the corresponding Nand pages, the criteria for predicting the next Nand pages being different than the criteria for predicting the subsequent Nand pages, and the criteria for predicting the subsequent Nand pages including information about previously predicted Nand pages, wherein the subsequent Nand pages are predicted to be accessed after the next Nand pages,
   wherein the first set of cache pages for the current Nand pages are preserved for at least two operation cycles before being overwritten.

2. The system of claim 1 wherein the memory page manager is further configured to update the correlation and save the updated correlation.

3. The system of claim 1 wherein the memory page manager is configured to send the current Nand pages loaded to the set of first cache pages to the controller during Nand idle time.

4. The system of claim 3 wherein the memory page manager is configured to predict the next Nand pages during the Nand idle time.

5. The system of claim 3 wherein the memory page manager is configured to load the next Nand pages to the set of second cache pages during the Nand idle time.

6. The system of claim 5 wherein the memory page manager is configured to load the next Nand pages to the set of second cache pages and send the current Nand pages loaded to the set of first cache pages to the controller concurrently.

7. The system of claim 1 wherein the memory page manager is further configured to validate the next Nand pages before sending the next Nand pages to the controller in accordance with at least a next read command.

8. The system of claim 1 further comprising a cache management unit managing the multiple cache pages.

9. The system of claim 1 wherein the multiple cache pages are sized in accordance with at least a size of the Nand pages.

10. A method of operating a semiconductor memory system comprising:
    sending a read command from a controller to a memory device;
    categorizing multiple cache pages in the memory device, the multiple cache pages including one or more first cache pages (set of first cache pages) for the current Nand pages, one or more second cache pages (set of second cache pages) for next Nand pages, and one or more third cache pages (set of third cache pages) for subsequent Nand pages, a size of each of the multiple cache pages being dynamically determined to be larger as Nand idle time increases and determined to be smaller as Nand idle time decreases;
    loading current Nand pages corresponding to the read command to the set of first cache pages;
    correlating the current Nand pages with the set of first cache pages using a memory page manager;
    predicting the next Nand pages to be requested based at least in part on the read command, the current Nand pages, or a combination thereof, using the memory page manager;
    loading the next Nand pages to the set of second cache pages;
    correlating the next Nand pages with the set of second cache pages; and
    managing correlation of the Nand pages that have been loaded to cache pages and their respective sets of cache pages;
    wherein each of the sets of second and third cache pages is categorized in accordance with criteria used to predict the corresponding Nand pages, the criteria for predicting the next Nand pages being different than the criteria for predicting the subsequent Nand pages, and the criteria for predicting the subsequent Nand pages including information about previously predicted Nand pages, wherein the subsequent Nand pages are predicted to be accessed after the next Nand pages,
    wherein the first set of cache pages for the current Nand pages are preserved for at least two operation cycles before being overwritten.

11. The method of claim 10 wherein the managing the correlation of the Nand pages that have been loaded to cache pages includes updating the correlation and saving the updated correlation.

12. The method of claim 10, further comprising sending the current Nand pages loaded to the set of first cache pages to the controller during Nand idle time.

13. The method of claim 12 wherein the predicting the next Nand pages is performed during the Nand idle time.

14. The method of claim 12 wherein the loading the next Nand pages to the set of second cache pages is performed during the Nand idle time.

15. The method of claim 14 wherein the loading the next Nand pages to the set of second cache pages and sending the current Nand pages loaded to the set of first cache pages to the controller is performed concurrently.

16. The method of claim 10 further comprising validating the next Nand pages before sending the next Nand pages to the controller in accordance with at least a next read command.

17. The method of claim 10 further comprising managing the multiple cache pages by a cache management unit.

18. The method of claim 10 wherein the multiple cache pages are sized in accordance with at least a size of the Nand pages.

19. The system of claim 1 wherein the criteria to predict the next Nand pages, in addition to the read command, are at least two of location of Nand pages relative to the current Nand pages, most-frequently requested Nand pages, and status of Nand pages.

20. The method of claim 10 wherein the criteria to predict the next Nand pages, in addition to the read command, are at least two of location of Nand pages relative to the current Nand pages, most-frequently requested Nand pages, and status of Nand pages.

* * * * *